United States Patent [19]

Korbonski et al.

[11] Patent Number: 5,349,714
[45] Date of Patent: Sep. 27, 1994

[54] SHEET CLEANING APPARATUS

[75] Inventors: John A. Korbonski, San Juan Capistrano; Eugene C. Greenwood, Costa Mesa, both of Calif.

[73] Assignee: Systems Division Incorporated, Mission Viejo, Calif.

[21] Appl. No.: 143,361

[22] Filed: Oct. 26, 1993

[51] Int. Cl.$^5$ ............................................. B08B 11/00
[52] U.S. Cl. ................................................ 15/3; 15/1; 15/102; 15/104.002
[58] Field of Search ............... 15/1.51, 3, 102, 256.52, 15/104.002, 1; 134/9; 355/296, 298

[56] References Cited

U.S. PATENT DOCUMENTS

4,009,047  2/1977  Lindsay ..................................... 134/9
4,982,469  1/1991  Nishiwaki ................................. 15/3

Primary Examiner—Edward L. Roberts
Attorney, Agent, or Firm—Roberts and Quiogue

[57] ABSTRACT

Apparatus for cleaning foreign particles from the surface of sheets of material, such as printed circuit boards during fabrication processing. Two pairs of sheet cleaning rollers are located along the sheet path, and the sheet is passed through the nips between the pairs of rollers. The rollers have a surface tack sufficient to transfer the foreign particles from the surfaces of the sheet to the cleaning roller surfaces. Upper and lower roller cleaning rolls having surfaces of even greater surface tack are arranged in tangential contact with respective ones of the sheet cleaning rollers. The surfaces of the roller cleaning rolls have even greater surface tack, sufficient to transfer the foreign particles from the sheet cleaning rollers to the cleaning roll surfaces. An adjustable preload force is applied to each roller cleaning roll to urge each roll against the sheet cleaning roller surfaces. The adjustable preload force also controls the nip pressure between the cleaning rollers and the sheet surface improving the cleaning ability of the system. The apparatus further includes a system for preventing delamination of layers of the sheet. Endless belts are reeved about pulleys and about grooves formed in the sheet cleaning rollers, and provide a belt region remaining in contact with the sheet even after the region of the sheet has passed through the nip of the cleaning rollers. This prevents the outer layer of the sheet from lifting away from the body of the sheet.

30 Claims, 6 Drawing Sheets

SHEET CLEANING APPARATUS

BACKGROUND OF THE INVENTION

The present invention relates to an apparatus for cleaning dust and other surface particulate contaminants from material in sheet form.

There are many applications employing material in sheet form in various processes. For example, in the fabrication of printed circuit boards, the boards are in sheet form, and typically must be cleaned prior to processing steps for defining circuit traces. A trend in the printed circuit board industry is toward increasing use of fine line printed wiring boards. Any small dirt particle can cause a defect, e.g., a short or open circuit. Thus, typically, layers of copper are formed on the outer surfaces of the circuit board, and the fine line circuit traces are defined by photolithographic processes. An intermediate step is the deposit of layers of photoresist material onto the copper layers. Outer thin layers of polyester, e.g., 0.001 inches in thickness are often laid over the photoresist to provide protection during intermediate processing. The photoresist layers may be exposed through the protective layers and a mask which defines the wiring pattern. Subsequent processing includes developing the photoresist. The outer surfaces of the polyester film are typically cleaned to remove dust and other foreign particles, which could otherwise interfere with such steps as the exposure of the photoresist. However, care must be taken to keep from removing the thin polyester films during the cleaning.

U.S. Pat. No. 4,009,047 describes an exemplary device for cleaning sheets, wherein a cleaning roller having a tacky surface is used to pickup dirts particles from a sheet. The device includes a sheet cleaning roller having a higher surface tack than the cleaning roller, to remove the dirt particles from the cleaning roller. The device is relatively complex and expensive to manufacture, and would tend to remove protective thin films as used to protect printed circuit boards during fabrication.

SUMMARY OF THE INVENTION

A sheet cleaning apparatus is described for cleaning foreign particles from at least one surface of a sheet. The apparatus includes a frame, and a sheet cleaning roller rotatably mounted on the frame. The sheet cleaning roller has a layer of resilient material defining a peripheral roller surface with a surface tack adapted to transfer foreign particles from the sheet to the peripheral roller surface upon contact and subsequent separation of the sheet and roller surface. The degree of surface tack permits clean subsequent separation between the sheet and the peripheral surface. The apparatus further includes a roller cleaning member having a contact surface with a width about the same as a width of said sheet cleaning roller surface, the contact surface having a greater surface tack with respect to the foreign particles than the sheet cleaning roller surface. The contact surface is adapted to transfer the foreign particles from the cleaning roller peripheral surface to the contact surface of the roller cleaning member. The cleaning member comprising a roll having an external surface defining the contact surface and a cleaning element axis arranged substantially parallel to the roller axis. In accordance with the invention, the apparatus further includes means for applying a selectively adjustable preload force to urge the roller cleaning contact surface into compressive contact with the roller surface.

In the preferred embodiment, the cleaning member comprises a roll of single sided adhesive tape, arranged with the adhesive side facing outwardly on the roll. As the roll external surface becomes covered with foreign particles transferred from the sheet cleaning roller, tape from the roll may be selectively manually removed to uncover a fresh adhesive surface. As tape is progressively removed from said roll, the diameter of the roll is reduced, and the means for applying a preload force moves the cleaning element roll axis toward the roller axis to maintain compressive contact between the roller surface and the cleaning surface.

In a preferred embodiment, the apparatus includes two pairs of sheet cleaning rollers for cleaning both surfaces of the sheet, and the roller cleaning element includes two rolls, one located above the two rollers located above the sheet, the other located below the two rollers located below the sheet. Pneumatic cylinders are employed to exert the preload force, one tending to pull the upper roll down against the two upper sheet cleaning rolls, the other tending to push the lower roll up against the two lower sheet cleaning rolls. The pneumatic pressure applied to the two cylinders can be independently adjusted by the machine operator, to allow different and varying preload pressures to be exerted by the two cleaning rolls.

In accordance with another aspect of the invention, useful when the sheet is a lamination of multiple sheet layers, the apparatus further can include means for preventing said layers from becoming delaminated due to adhesive forces between the tacky sheet cleaning roller surface and the sheet surface. An endless belt is reeved about a first pulley disposed on a downstream side of the sheet cleaning roller and arranged to fit into a peripheral groove defined in the roller. The belt is arranged to rotate with the roller and contacting the sheet surface along a region downstream from the roller to keep a surface layer of the sheet from delaminating.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

FIGS. 1-10 illustrate an exemplary embodiment of a sheet cleaning apparatus 50 embodying this invention. The apparatus 50 includes two pairs of sheet-contacting cleaning rollers 52, 54 and 56, 58. Rollers 52 and 54 are disposed in vertical alignment adjacent each other to define a nip 60. Rollers 56 and 58 are disposed in vertical alignment adjacent each other to define a nip 62. As in the device of U.S. Pat. No. 4,009,047, the surfaces of the cleaning rollers 52, 54, 56 and 58 are defined by a layer of resilient compressible material which has a surface tack or adhesion sufficient to transfer dust and other foreign particulate contamination from a sheet coming into compressive contact with the roller surface. It is also desirable that the roller surfaces be smooth, in order to obtain complete contact with the surface of a sheet pressed against the surface. Typically, the roller surfaces will have a Shore A durometer value of up to 35.

Figure 1:
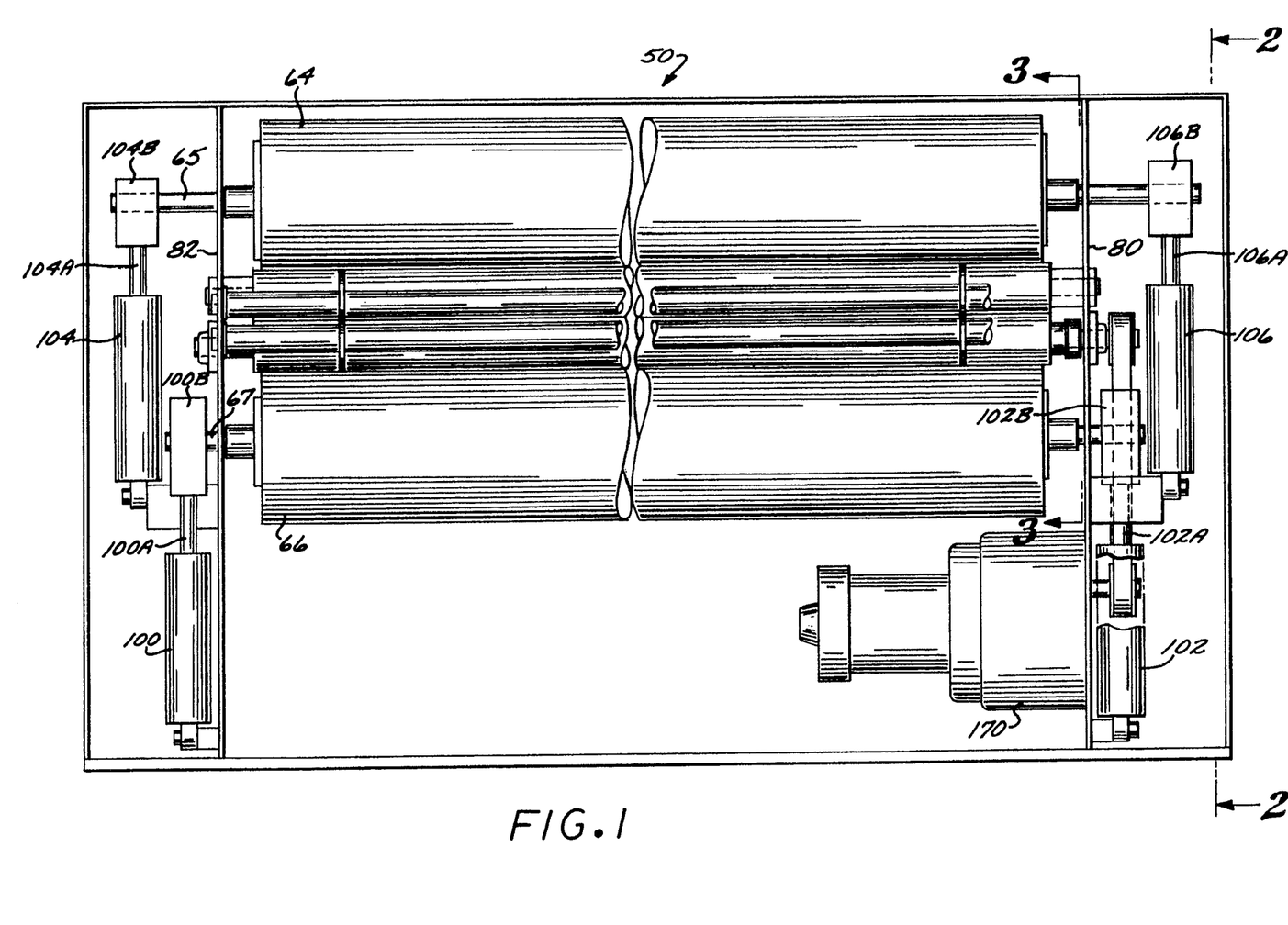
FIG. 1 is a front view of a sheet cleaning apparatus embodying the invention.
Figures 2, 3, 4, 5, 6:
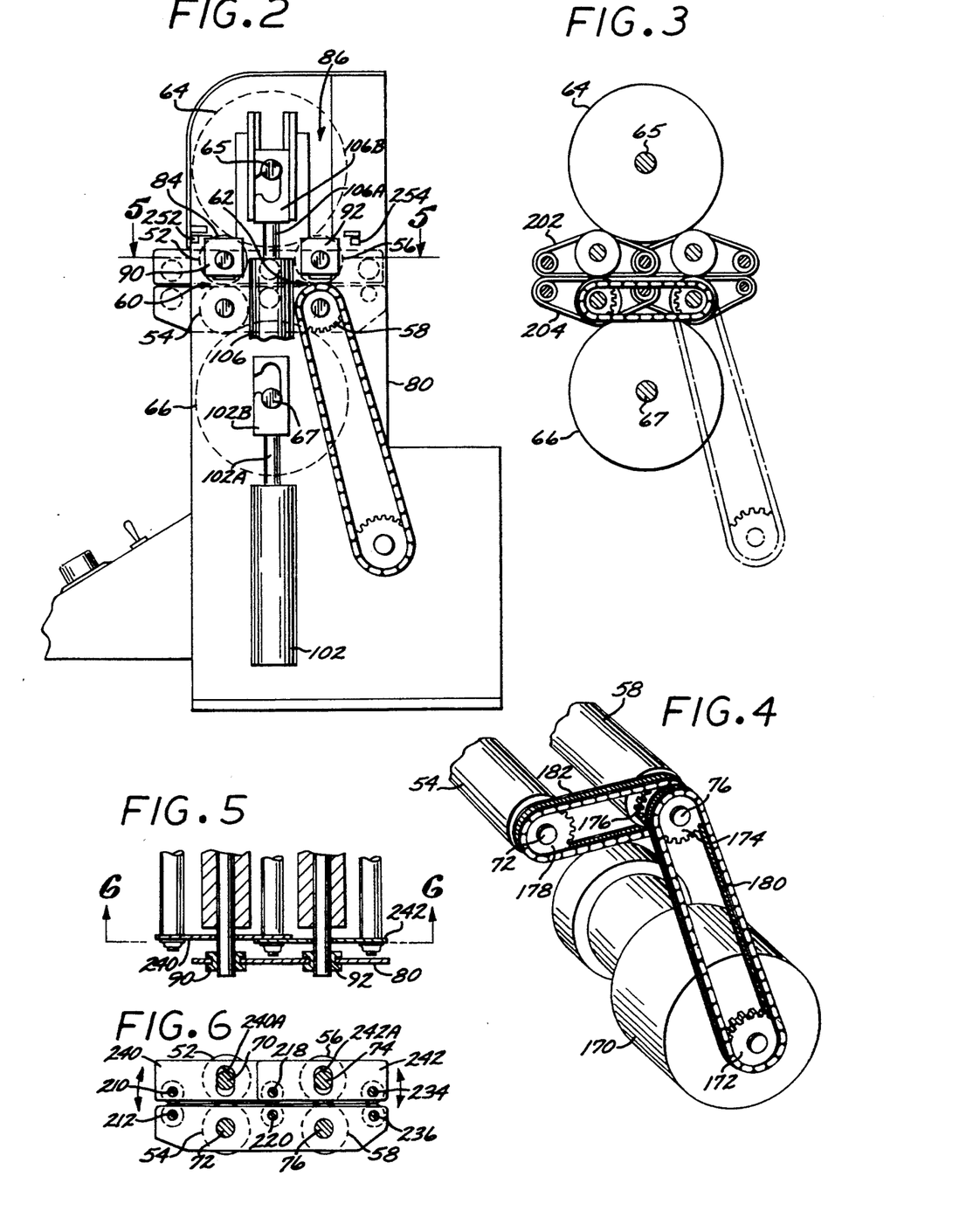
FIG. 2 is a side cross-sectional view taken along line 2—2 of FIG. 1.
FIG. 3 is a simplified side cross-sectional view taken along line 3—3 of FIG. 1.
FIG. 4 is an isometric view showing the motor drive of the cleaning rollers of the apparatus of FIG. 1.
FIG. 5 is a cross-sectional view taken along line 5—5 of FIG. 2.
FIG. 6 is a cross-sectional view taken along line 6—6 of FIG. 5.

In order to clean the surfaces of the sheet cleaning rollers 52-58, rolls 64, 66 of adhesive-coated tape are provided. These rolls 64, 66 are disposed so as to be in contact with respective surfaces of rollers 52-58 during sheet cleaning operations, as shown in FIG. 2. In a general sense, the rolls 64, 66 are defined by rolls of tape having the adhesive coating on the outward facing sides. The external surface of each of the rolls 64, 66 has a surface tack which greatly exceeds the surface tack of the sheet cleaning rollers 52-58, in order to transfer the foreign particles from the sheet cleaning rollers 52-58 to the surfaces of rolls 64, 66.

The lower two sheet-contacting cleaning rollers 54 and 58 are mounted on roller shafts 72 and 76. These shafts are secured in stationary positions in the opposed structure plates 80 and 82 comprising the frame of the apparatus, while permitting the rollers 54 and 58 to freely roll about the respective shaft axis.

The two upper sheet-contacting cleaning rollers 52 and 56 are mounted for rotation on roller shafts 70 and 74. In contrast to the fixing of the lower shafts 72 and 76, the shafts 70 and 74 have freedom of movement to slide along the vertical extent of slots 84 and 86 defined in plate 80, and in corresponding slots formed in opposing structure plate 82 (not shown). Thus, bushings 90 and 92 are fitted to the ends of shafts 70 and 74 to hold the shafts within the lateral extent of the slots formed in the structure plate 80; similar bushing secured the opposite ends of the shafts within the lateral extent of the slots in plate 82. It will thus be appreciated that the sheet-contacting cleaning rollers 52 and 56 may be removed from the apparatus by lifting the rollers upwardly and out of engagement with the slots, once roll 64 has been removed.

In accordance with one aspect of the invention, the apparatus 50 includes a system for applying a variable preload force, urging roller 64 into engagement with surfaces of rollers 52 and 56, and urging roller 66 into engagement with surfaces of rollers 54 and 58. This system includes pneumatic cylinders 100 and 102 which support the lower tape roller 66, and pneumatic cylinders 104 and 106 which support the upper tape roller 64. Cylinder 100 includes a rod 100A driven by a cylinder piston to an extended position. The rod is attached to a coupler 100B which has a transverse opening into which an end of shaft 67 carrying roll 66 is inserted. Cylinder 102 includes rod 102A driven by a cylinder piston to an extended position. Rod 102A is attached to a coupler 102B which has a transverse opening into which the opposed end of shaft 67 is inserted. The roll 66 is therefore supported by the system comprising cylinders 100 and 102 and couplers 100B and 102B. The cylinders 100 and 102 are single acting, spring biased devices, wherein the rods are spring biased to the fully retracted position, and the rods are extended against the bias when pneumatic pressure is applied to the cylinders. Further, the compression contact force of the roll 66 in relation to the sheet cleaning rollers 54 and 58 is adjustable by adjusting the pneumatic pressure applied to the cylinders.

In a similar fashion, cylinders 104 and 106 include respective rods 104A and 104B and couplers 104B and 106B. The couplers have respective transverse openings which receive ends of shaft 65 carrying roll 64. The cylinders 104 and 106 are also spring biased, single acting cylinders; however, the rods are biased to the fully extended position, tending to lift the roll 64 away from the sheet cleaning rollers 52 and 56. Application of pneumatic pressure to the cylinders 104 and 106 retracts the rods 104A and 106A, drawing the roll 64 against the surfaces of rollers 52 and 56. The cylinders 104 and 106 and couplers 104B and 106B comprise a system for supporting and manipulating roll 64. The compression contact force of roll 64 in relation to rollers 52 and 56 is adjustable by varying the pneumatic pressure applied to the cylinders 104 and 106.

Figure 9:
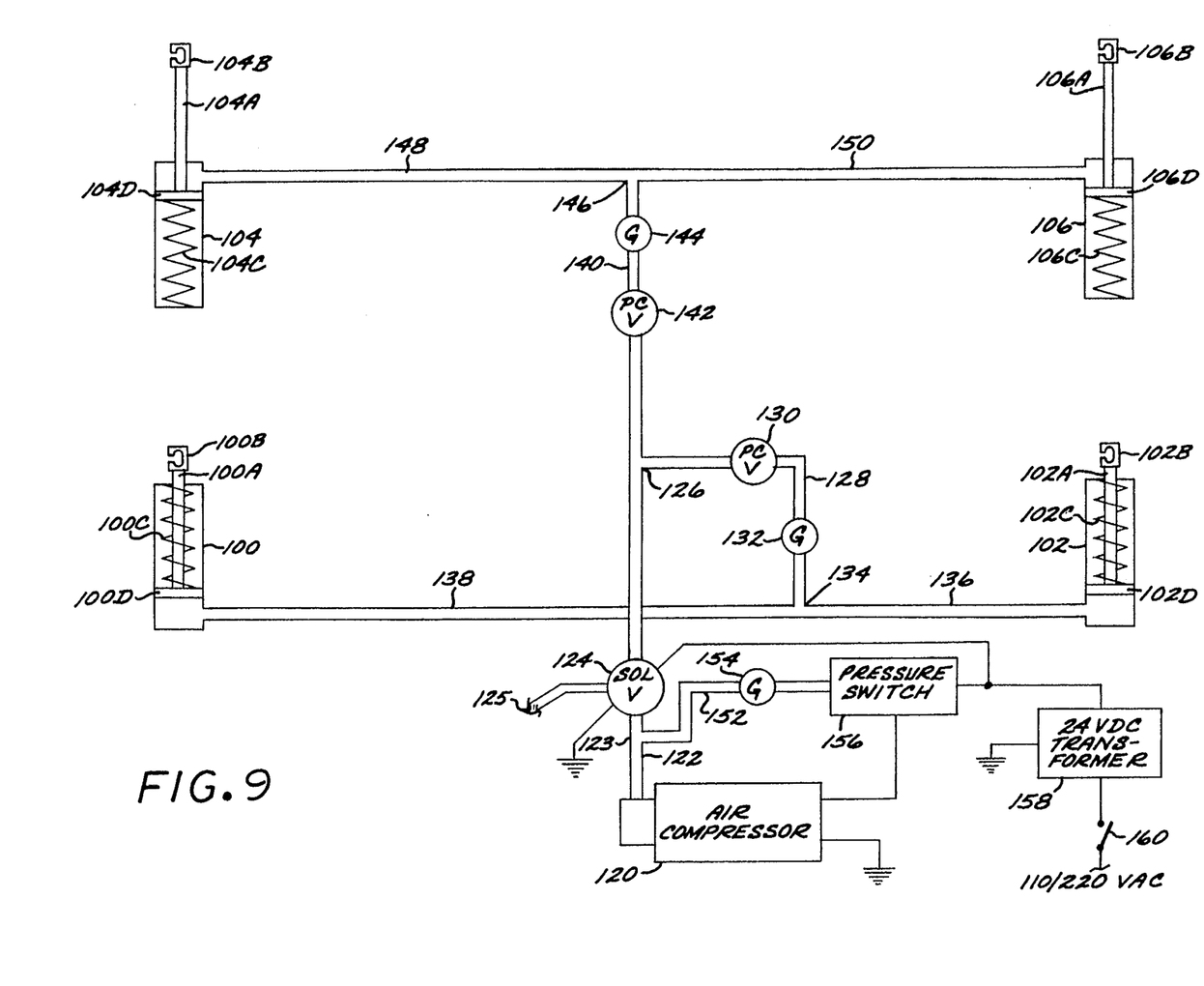
FIG. 9 is a simplified control system block diagram of the apparatus of FIG. 1.

The pneumatic system comprising the cylinders 100, 102, 104 and 106 is shown in further detail in FIG. 9. An air compressor 120 delivers a supply of compressed air to line 122, which at T connection 126 branches to separate lines 128 and 140 to supply the lower cylinders 100 and 102 and the upper cylinders 104 and 106 respectively. A T connection in line 122 delivers air from compressor 120 in line 152 through gauge 154 to pressure switch 156.

The pressure switch, solenoid valve 124 and compressor 120 are powered in this embodiment by a low voltage supply from 24 VDC transformer 158, connected to the 110/220 VAC supply via system switch 160. The compressed air in lines 128 and 140 is passed through manually adjusted pressure control valves 130 and 142, permitting the machine operator to manually adjust the pressure applied to the lower set of cylinders 100 and 102, and independently set the pressure applied to the upper set of cylinders 104 and 106, as well as the couplers 100B, 102B, 104B and 106B. Pressure gauges 132 and 144 are respectively installed in the lines 128 and 140, respectively, to provide an indication of the air pressure in the respective lines. Line 128 branches into separate cylinder supply lines 136 and 138 at T connection 134, with line 136 supplying cylinder 102, and line 138 supplying cylinder 138. Similarly, line 140 branches into separate supply lines 148 and 150 at T connection 146, with line 148 supplying cylinder 104 and line 150 supplying cylinder 106.

When the main power switch 160 is turned on, 3-way solenoid valve 124 is energized to the closed position closing the pneumatic circuit. Simultaneously, the air compressor 120 is switched on, building pressure in the pneumatic circuit. When pressure in the circuit reaches the selected pressure set on the adjustable pressure switch 156, the pressure switch turns off the electricity to the air compressor, stopping it. Air pressure in the circuit holds at the selected level. When the machine operator manually adjusts the pressure for the upper and lower preload systems via control valves 130 and 142, the pressure switch may detect a lowering of the pressure, and turn on the compressor as required until the preset pressure level is achieved.

The capability to select the preload force applied by the upper roll 64 permits the apparatus to control and uniformly maintain the pressure applied at the nips 60 and 62, regardless of the weight of the roll 64. A fresh roll 64 is typically installed in the machine 50 when the machine switch 160 is off. Similarly, a dirty layer of adhesive coated tape typically removed from the roll 64 with the switch 160 in the off position. Thereafter, when the machine 50 is switched on, the air compressor 120 will be switched on to bring the pneumatic system pressure up to the level set by the pressure switch 156. That preset pressure level is sufficient to pull the roll 64 down against the bias of springs 104C and 106C into contact with the cleaning rollers 52 and 56. At that time, the machine operator reduces air pressure in line 140, from the initial pressure set by the pressure switch 156, by operating pressure control valve 142, to the point of separation of the surfaces of the cleaning rollers 52, 56 from the surface of the roll 64. Then the pressure is increased slowly until the couplers 104B and 106B make contact with the shaft 65 supporting the roll 64.

The preload system for the lower roll 66 moves the roll 66 upwardly and presses the roll 66 against the lower pair of cleaning rollers 54 and 58. As the adhesive coated paper or tape is removed from the roll 66 during operation of the machine 50, the weight of the roll decreases. In order to maintain a uniform, substantially constant pressure between the surface of roll 66 and the surfaces of the cleaning rollers 54 and 58, the air pressure in the line 128 is increased as the roll 66 gets smaller. The machine 50 is typically switched off when the roll 66 is changed or when a dirty layer of adhesive coated paper is removed from the roll to expose a fresh layer. When the machine is switched off, the springs 100C and 102C push the roll 106 down and out of contact with the cleaning rollers 54 and 58. When the machine 50 is turned after such servicing, the operator adjusts the control valve 130 to slowly increase the pressure, in opposition to the spring bias force, to the point of contact between the surface of roll 66 and the sheet cleaning rollers 54 and 58. In a particular embodiment, the pressure is then further increased by 5 PSIG. Of course, the foregoing procedure for setting the pneumatic line pressures set forth by way of example only, and are not required for all applications. Modifications to this procedure can be made, as dictated by the requirements of a particular application.

When the main power is turned off, the solenoid valve is de-energized and opens, exhausting all air in the system through vent 125. All cylinders are spring returned to a position wherein adhesive coated rollers 62 and 66 are removed from contact with cleaning rollers 52, 54, 56 and 58. This feature prevents the problem of the sheet cleaning rollers becoming adhered to the rolls 64, 66 as a result of long, uninterrupted contact therebetween while the machine is turned off and not in use.

FIG. 9 also diagrammatically shows the bias springs 100C, 102C, 104C and 106C and cylinder pistons 100D, 102D, 104D and 106D for the corresponding cylinders 100, 102, 104 and 106, as well as the couplers 100B, 102B, 104B and 106B. The rods 100A, 102A and pistons 100D, 102D are spring retracting, and extend on pressure. The rods 104A, 106A and pistons 104D, 106D are spring extending, and retract on pressure.

The sheet cleaning rollers 54 and 58 are driven by motor 170, as shown most clearly in FIG. 4. A sprocket 172 is mounted on the motor shaft. Sprockets 174 and 176 are mounted on roller shaft 76. Sprocket 178 is mounted on shaft 72. Drive chain 180 is reeved about sprockets 172 and 174; chain 182 is reeved about sprockets 176 and 178. Operation of motor 170 therefore results in rollers 54 and 58 being rotationally driven in the same direction. The upper two cleaning rollers 52 and 56 are idler rollers, driven by contact with the surface of the sheet passing through the nips 60, 62 between the two sets of rollers.

Figure 7:
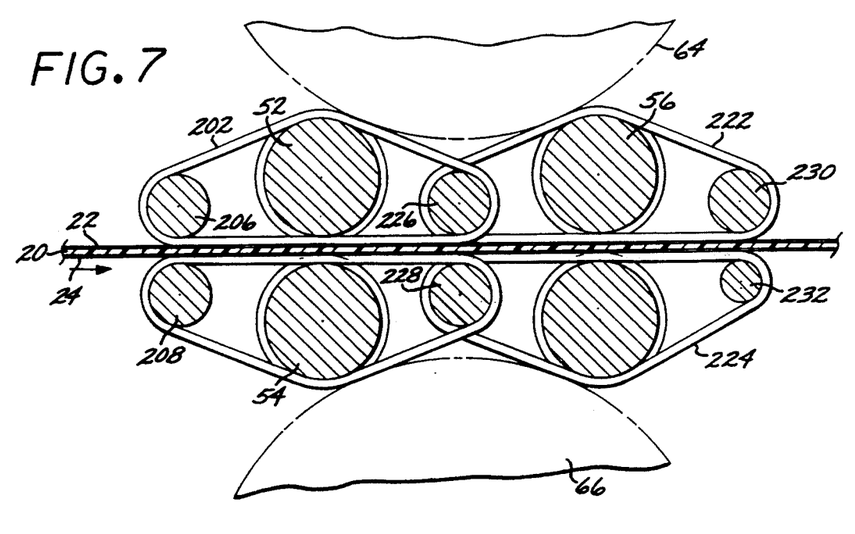
FIGS. 7 and 8 show the cleaning rollers and anti-lift-off belts of the apparatus of FIG. 1.
Figure 8:
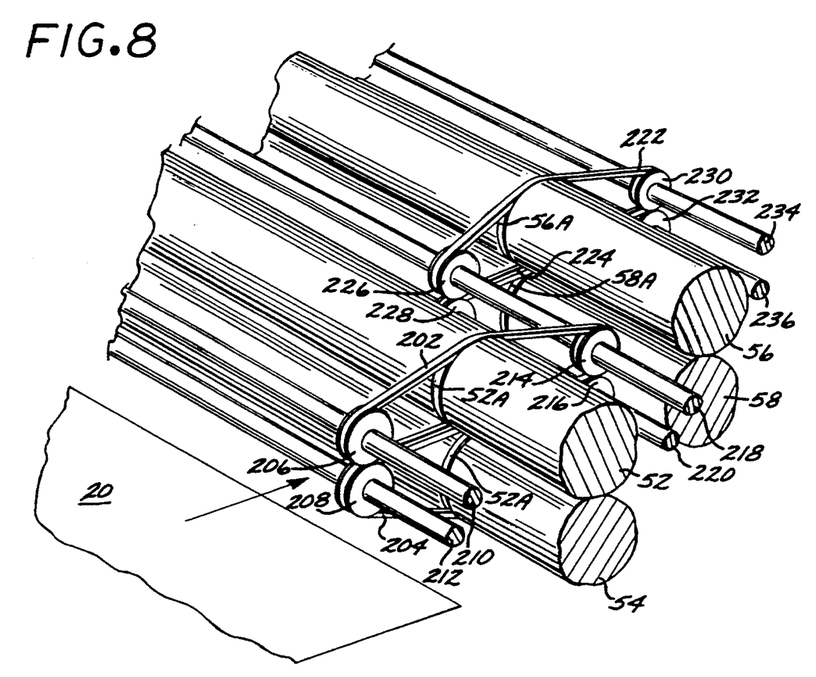

Referring now to FIGS. 3, 7 and 8, another feature of the invention is illustrated. To prevent the thin protective layers of flexible material such as polyester film covering surfaces of the sheet from being de-laminated from the sheet passing through the machine, an anti-liftoff system may be included. The system includes belt 202 reeved about pulleys 206 and 214, and belt 204 reeved about pulleys 208 and 216. The belts are received in grooves 52A and 56A formed respectively in the surfaces of sheet cleaning rollers 52 and 56. The depth of the grooves and the thickness of the belts are selected so that the outer surface of the respective belt is flush with the exterior surface of the respective rollers 52 and 56. The belts may be made from polyurethane, viton or other material commonly used as drive belts. The pulleys 206, 208, 214 and 216 are mounted for rotation about respective pulley shafts 210, 212, 218 and 220. The belts 202 and 204 are arranged to contact the exterior facing surfaces of protective films 22 and 24 which are disposed on the respective opposed surfaces of the sheet 20. As the film and sheet laminate are passed through the nip 60 between rollers 52 and 54, the belts contact the films 22 and 24 both before and after contact with the cleaning rollers occurs. Hence, the belts 202 and 204 prevent the films from lifting off the respective surfaces of the sheet 20 in response to the tackiness of the surfaces of the cleaning rollers 52, 56. Typically the belts 202 and 204 are set adjacent one edge of the rollers 52 and 56; another set of belts (not shown) will be disposed adjacent the opposed edge of the rollers 52 and 56 to prevent liftoff across the lateral extent of the sheet 20. Additional sets of belts between the belts at the edges can be included is required for a particular application.

To prevent the tackiness of the sheet cleaning rollers 54 and 58 from lifting the films 22 and 24 off the opposed surfaces of the sheet 20, another set of belts 222 and 224 is provided, offset from the first set of belts 202 and 204. Offsetting each set of belts on cleaning rollers 52 and 54 from the sets of belts on rollers 56 and 58 insures that all areas of films 22 and 24 have contact with and are cleaned by contact with at least one face of a tacky roller. Belt 222 is reeved about pulleys 226 and 230, supported on shafts 218 and 234. Belt 224 is reeved about pulleys 228 and 232, supported on shafts 220 and 236. The belts 222 and 224 fit into grooves 56A and 58A formed in the outer periphery of rollers 56 and 58.

The supporting shafts 72 and 76 for the lower set of sheet cleaning rollers 54 and 58, and the lower set of belt pulley support shafts 212, 220 and 236 are fixed in relative position to the side plates 80 and 82. The supporting shafts 70 and 74 for the upper set of sheet cleaning rollers 52 and 56, and the upper set of belt pulley support shafts 210, 218 and 230, however, are permitted to move in relation to the side plates 80 and 82, and to a limited extent in relation to each other. FIGS. 5 and 6 illustrate the manner in which the shafts on one side of the rollers are secured in relation to plate 80. A pair of bars 240 and 242 have spaced openings formed therein to receive ends of the roller and pulley supporting shafts. Bar 240 receives ends of shafts 210, 70 and 218; bar 242 receives ends of shafts 234, 74 and 218. The openings for roller shafts 70 and 72 are slots 240A and 242A, thereby permitting these shafts some vertical freedom of movement. In effect, the bars 240 and 242 are hinged about shaft 218, permitting for example shaft 210 to raise slightly relatively to shaft 234 in response to the thickness of the sheet 20 entering the nip 60.

Figure 10:
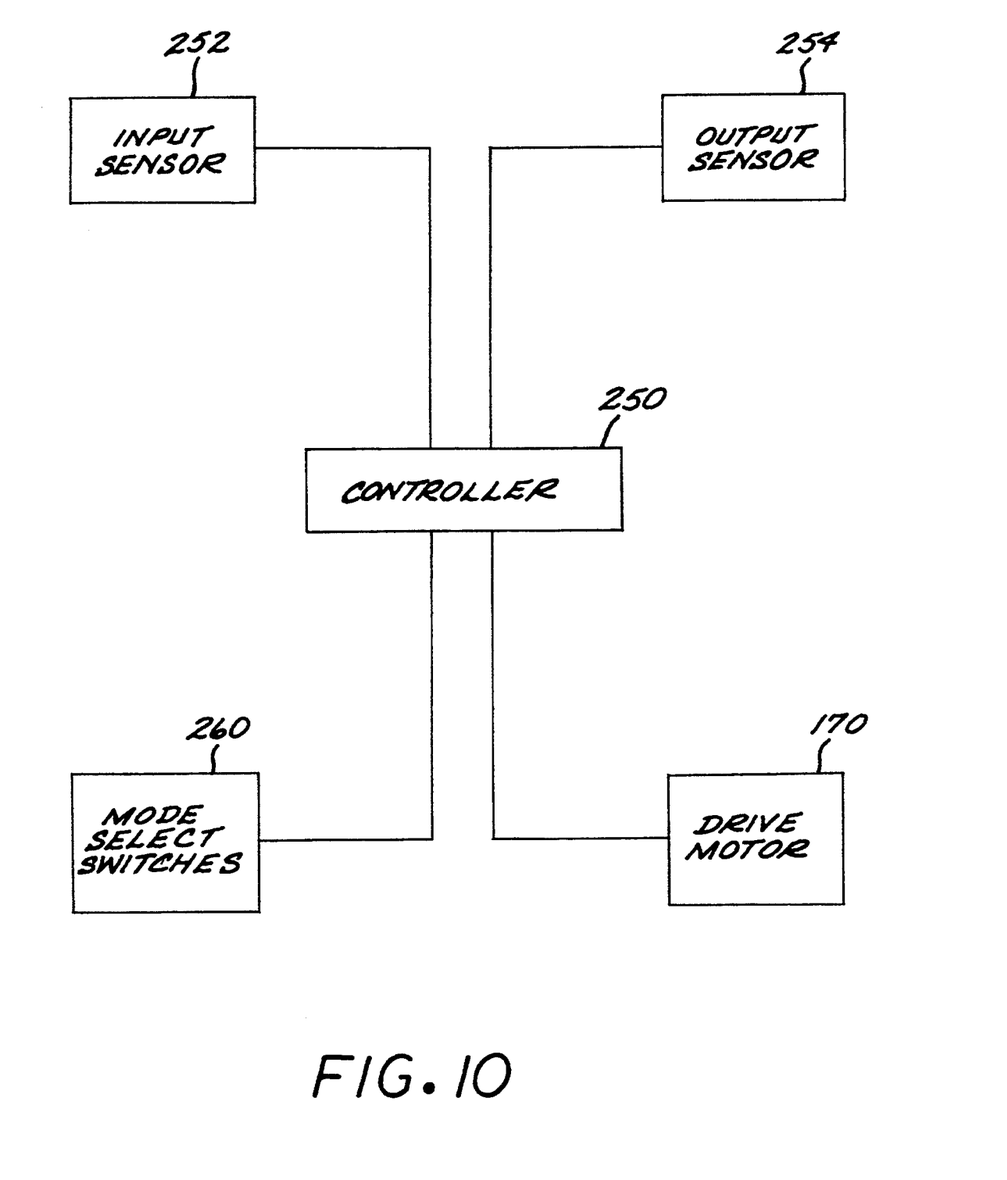
FIG. 10 is a simplified schematic diagram illustrating the drive motor control for the apparatus.

FIG. 10 illustrates a simplified schematic diagram of the control circuit for controlling the roller drive motor 170. The circuit includes an infrared input sensor 252, and infrared output sensor 254, mode select switches 260 and a controller 250, which may take the form of logic circuitry, a microprocessor, or other well known circuits for achieving logical control. In this exemplary embodiment, there are four selectable modes of operation for the machine 50. Two are continuous operation modes, one in the forward direction to drive the sheet in the direction indicated in FIG. 8, the other in the reverse direction. The continuous operation modes are useful in applications such as where the machine in place at an entrance to a clean room to clean sheets as they enter the clean room. In these modes, the motor continuously drives the cleaning rollers in the selected direction. In a third mode, the single pass mode, the input sensor responds to the insertion of a sheet into the machine, and the controller turns on the drive motor to drive the sheet through the cleaning rollers, until an output signal is received from the output sensor, indicated that the trailing edge of the sheet has been ejected from the cleaning rollers. The motor is then turned off. The fourth operating mode is the double pass mode, wherein the sheet is received into the machine, and the drive motor turned on to drive the sheet through the cleaning rollers. When the output sensor indicates that the trailing edge of the sheet has passed through the nip 62, the motor is reversed to pull the sheet back through the cleaning rollers in the opposite direction, until the input sensor is triggered to indicate the sheet has passed out of the nip 60. The motor is then turned off.

Figure 11:
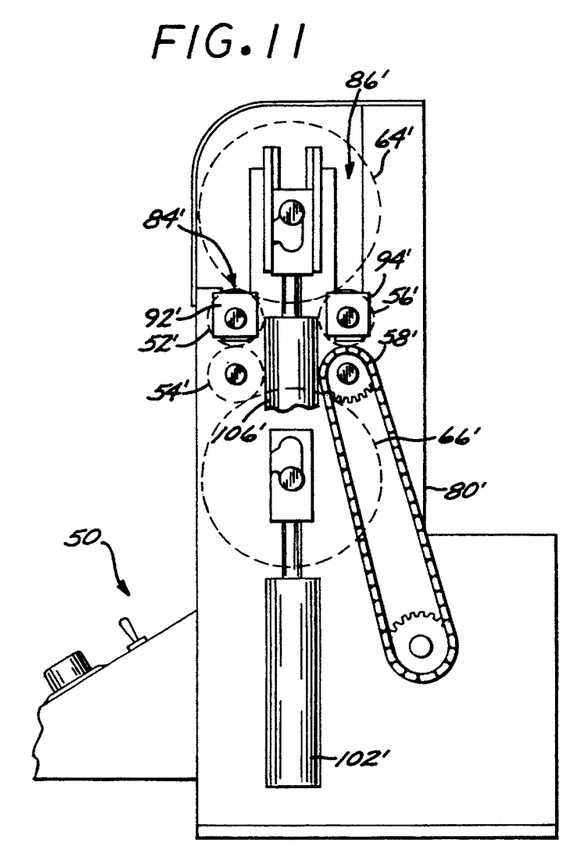
FIGS. 11 and 12 illustrate an alternate embodiment of a sheet cleaning apparatus in accordance with the invention.
Figure 12:
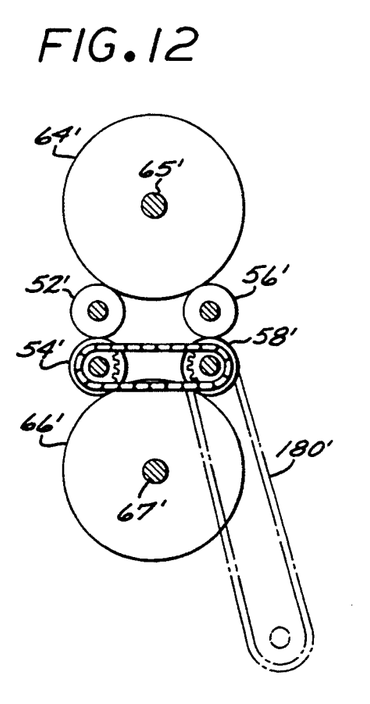

FIGS. 11 and 12 illustrate an alternate embodiment 50' of the sheet cleaning apparatus, wherein the system of belts and pulleys for preventing surface layer delamination is omitted. This simplifies the construction, such that the bearings 92' and 94' supporting rollers 52' and 56' constrained by the edges of the slots 84' and 86' formed in plates 80' and 82' yet permitting the rollers 52' and 56' to be separately removed from the machine. Many applications will not need the delamination system of the machine 50, particularly if the layers of a laminated sheet are well adhered to one another. The apparatus 50' may then be used for such applications, at lower costs than a machine including the delamination system.

It is understood that the above-described embodiments are merely illustrative of the possible specific embodiments which may represent principles of the present invention. For example, instead of employing two sets of upper and lower sheet cleaning rollers to clean the upper and lower surfaces of the sheet, a single upper or lower cleaning roller may be used, e.g., when only one surface need be cleaned, or a single upper and lower roller when both surfaces are to be cleaned. Other arrangements may readily be devised in accordance with these principles by those skilled in the art without departing from the scope and spirit of the invention.

What is claimed is:

1. A sheet cleaning apparatus for cleaning foreign particles from at least one surface of a sheet, comprising:
   a frame;
   a sheet cleaning roller rotatably mounted on said frame for rotation about a sheet cleaning roller axis and comprising a layer of resilient material defining a peripheral roller surface with a high surface tack adapted to transfer foreign particles from said sheet to said peripheral roller surface upon contact and subsequent separation therebetween while affording clean separation between the sheet and said peripheral surface;
   a roller cleaning member having a contact surface with a width about the same as a width of said sheet cleaning roller surface, said contact surface having a greater surface tack with respect to said foreign particles than said sheet cleaning roller surface, said contact surface adapted to transfer said foreign particles from said peripheral surface of said cleaning roller to said contact surface of said roller cleaning member, said roller cleaning member comprising a roll having an external surface defining said contact surface and a cleaning element axis arranged substantially parallel to said roller axis; and
   means for applying a selectively adjustable preload force to urge said contact surface into contact with said roller surface during sheet cleaning operation of said apparatus.

2. The cleaning apparatus of claim 1 wherein said cleaning member comprises a roll of single sided adhesive tape, arranged with the adhesive side facing outwardly on the roll, wherein as said roll external surface becomes loaded with said foreign particles, tape from said roll may be selectively removed to uncover a fresh adhesive surface as said cleaning element external surface.

3. The cleaning apparatus of claim 2 wherein, as said tape is removed from said roll, a diameter of said roll is reduced, and said means for applying a preload force moves said cleaning element roll axis toward said roller axis to maintain compressive contact between said roller surface and said cleaning surface.

4. The cleaning apparatus of claim 1 wherein said sheet is a lamination of multiple sheet layers, and said apparatus further comprises means for preventing said layers from becoming delaminated due to adhesive forces between said tacky sheet cleaning roller surface and said sheet surface.

5. The cleaning apparatus of claim 4 wherein said means for preventing said layers from becoming delaminated comprises an endless belt reeved about a first pulley disposed on a downstream side of said sheet cleaning roller and arranged to fit into a peripheral groove defined in said roller, said belt arranged to rotate with said roller and contacting said surface along a region downstream from said roller to keep a surface layer of said sheet from delaminating.

6. The cleaning apparatus of claim 1 further comprising means for urging said contact surface of said roller cleaning member out of contact with said sheet cleaning roller surface during periods in which said apparatus in not in operation.

7. The cleaning apparatus of claim 6 wherein said apparatus comprises means for selectively connecting and disconnecting a power source to said apparatus, and said means for urging said contact surface out of contact with said sheet cleaning roller surface comprises means automatically actuated when said power source is disconnected from said apparatus, thereby preventing said contact surface from becoming affixed to said roller surface during periods in which said apparatus is not in operation.

8. A sheet cleaning apparatus for cleaning foreign particles from first and second opposed surfaces of a sheet, comprising:
a frame;
first and second sheet cleaning rollers rotatably mounted on said frame for rotation about respective first and second sheet cleaning roller axes, each roller comprising a layer of resilient material defining a peripheral roller surface with a high surface tack adapted to transfer foreign particles from said sheet to said peripheral roller surface upon contact and subsequent separation therebetween while affording clean separation between the sheet and said peripheral surface, said first and second rollers disposed adjacent each other with said axes disposed in parallel to receive therebetween a sheet having said surfaces to be cleaned;
first and second roller cleaning members respectively disposed adjacent said first and second sheet cleaning rollers, each roller cleaning member having a contact surface with a width about the same as a width of said sheet cleaning roller surface, said contact surface having a greater surface tack with respect to said foreign particles than said sheet cleaning roller surface, said contact surface adapted to transfer said foreign particles from said peripheral surface of said cleaning roller to said contact surface of said roller cleaning member, each said cleaning member comprising a roll having an external surface defining said contact surface and a cleaning element axis arranged substantially parallel to said respective roller axes;
first preloading means for applying a selectively adjustable first preload force to urge said contact surface of said first roller cleaning member into contact with said first roller surface; and
second preloading means for applying a selectively adjustable second preload force to urge said contact surface of said second roller cleaning member into contact with said second roller surface.

9. The sheet cleaning apparatus of claim 8 wherein said first and second roller cleaning members comprise respective first and second rolls of single sided adhesive tape, arranged with the adhesive side facing outwardly on the roll, wherein as said respective roll external surfaces become loaded with said foreign particles, tape from said rolls may be selectively removed to present fresh adhesive surfaces as said cleaning element external surfaces.

10. The cleaning apparatus of claim 9 wherein, as said tape is removed from a given one of said roll, a respective diameter of said given roll is reduced, and said corresponding first or second preloading means moves said respective cleaning element roll axis toward said corresponding roller axis to maintain contact between said first or second roller surface and said corresponding cleaning surface.

11. The cleaning apparatus of claim 8 wherein said sheet is a lamination of multiple sheet layers, and said apparatus further comprises means for preventing said layers from becoming delaminated due to adhesive forces between said tacky sheet cleaning roller surfaces and said sheet surfaces.

12. The cleaning apparatus of claim 11 wherein said means for preventing said layers from becoming delaminated comprises a first endless belt reeved about a first pulley disposed on a downstream side of said first sheet cleaning roller and arranged to fit into a first peripheral groove defined in said roller, said belt arranged to rotate with said roller and contacting a first one of said sheet surfaces along a first region downstream from said first roller to keep a first surface layer of said sheet from delaminating, and a second endless belt reeved about a second pulley disposed on a downstream side of said second sheet cleaning roller and arranged to fit into a first peripheral groove defined in said roller, said second belt arranged to rotate with said second roller and contacting a second one of said sheet surfaces along a second region downstream from said first roller to keep a second surface layer of said sheet from delaminating, said endless belts holding a surface sheet layer of said lamination against an underlying sheet layer until said sheet has exited contact with said sheet cleaning rollers.

13. The sheet cleaning apparatus of claim 8 wherein said first preloading means comprises first pneumatic cylinder means for urging said first roller cleaning surface against said first sheet cleaning roller surface, and pressure adjusting means for adjusting the pneumatic pressure applied to said cylinder means to thereby adjust said first preload force.

14. The apparatus of claim 13 wherein said sheet is fed through said apparatus along a substantially horizontal sheet path, and said first roller is disposed vertically above said sheet path and said second roller is disposed vertically below said sheet path, and wherein said pneumatic cylinder means is arranged to apply a first preload force on said first cleaning roller in a substantially vertical downward direction.

15. The apparatus of claim 14 wherein said second preloading means comprises second pneumatic cylinder means for urging said second roller cleaning surface against said second sheet cleaning roller surface, and second pressure adjusting means for adjusting the pneumatic pressure applied to said second cylinder means to thereby adjust said second preload force.

16. The apparatus of claim 15 further comprising means for urging said contact surfaces of said first and second roller cleaning members out of contact with said respective peripheral roller surfaces of said sheet cleaning rollers when no pneumatic pressure is applied to said first and second pneumatic cylinder means.

17. The apparatus of claim 16 wherein said means for urging said contact surfaces out of contact with said roller surfaces comprises spring biasing means comprising said respective pneumatic cylinder means.

18. The apparatus of claim 13 wherein said sheet is fed through said apparatus along a substantially horizontal sheet path, and said first roller is disposed vertically above said sheet path and said second roller is disposed vertically below said sheet path, and wherein said pneumatic cylinder means is arranged to apply a first preload force on said first cleaning roller in a substantially vertical downward direction.

19. A sheet cleaning apparatus for cleaning foreign particles from first and second opposed surfaces of a sheet, comprising:

a frame;

first and second pairs of sheet cleaning rollers rotatably mounted on said frame for rotation about respective sheet cleaning roller axes, each roller comprising a layer of resilient material defining a peripheral roller surface with a high surface tack adapted to transfer foreign particles from said sheet to said peripheral roller surface upon contact and subsequent separation therebetween while affording clean separation between the sheet and said peripheral surface, the rollers of each pair disposed adjacent each other with said axes disposed in parallel to receive therebetween a sheet having said surfaces to be cleaned, said pairs being spaced along a sheet path through said apparatus;

first and second roller cleaning members disposed on opposite sides of said sheet path and spaced from said opposed surfaces of said sheet such that corresponding ones of said sheet cleaning rollers of each pair are respectively disposed between said roller cleaning member and said sheet path, each roller cleaning member having a contact surface with a width about the same as a width of said sheet cleaning roller surface, said contact surface having a greater surface tack with respect to said foreign particles than said sheet cleaning roller surface, said contact surface adapted to-transfer said foreign particles from said peripheral surface of said cleaning roller to said contact surface of said roller cleaning member, each said cleaning member comprising a roll having an external surface defining said contact surface and a cleaning element axis arranged substantially parallel to said respective roller axes, said first roll disposed in tangential contact with surfaces of said corresponding ones of said pairs of sheet cleaning rollers;.

first preloading means for applying a selectively adjustable first preload force to urge said contact surface of said first roller cleaning member into contact with said corresponding roller surfaces; and second preloading means for applying a selectively adjustable second preload force to urge said contact surface of said second roller cleaning member into contact with said corresponding roller surfaces.

20. The sheet cleaning apparatus of claim 19 wherein said first and second cleaning members comprise respective first and second rolls of single sided adhesive tape, arranged with the adhesive side facing outwardly on the roll, wherein as said respective roll external surfaces become loaded with said foreign particles, a layer of tape from said rolls may be selectively removed to present fresh adhesive surfaces as said cleaning element external surfaces.

21. The cleaning apparatus of claim 20 wherein, as said layer of tape is removed from a given one of said rolls, a respective diameter of said given roll is reduced, and said corresponding first or second preloading means moves said respective cleaning element roll axis toward said corresponding roller axis to maintain contact between said first or second roller surface and said corresponding cleaning surface.

22. The cleaning apparatus of claim 19 wherein said sheet is a lamination of multiple sheet layers, and said apparatus further comprises means for preventing said layers from becoming delaminated due to adhesive forces between said tacky sheet cleaning roller surfaces and said sheet surfaces.

23. The cleaning apparatus of claim 22 wherein said means for preventing said layers from becoming delaminated comprises a first endless belt reeved about a first pulley disposed on a downstream side of a first sheet cleaning roller of said first pair and arranged to fit into a first peripheral groove defined in said roller, said belt arranged to rotate with said roller and contacting a first one of said sheet surfaces along a first region downstream from said first roller to keep a first surface layer of said sheet from delaminating, and a second endless belt reeved about a second pulley disposed on a downstream side of a second sheet cleaning roller of said first pair and arranged to fit into a first peripheral groove defined in said roller, said second belt arranged to rotate with said second roller and contacting a second one of said sheet surfaces along a second region downstream from said first roller to keep a second surface layer of said sheet from delaminating.

24. The sheet cleaning apparatus of claim 19 wherein said first preloading means comprises first pneumatic cylinder means for urging said first roller cleaning surface against said corresponding sheet cleaning roller surfaces, and pressure adjusting means for adjusting the pneumatic pressure applied to said cylinder means to thereby adjust said first preload force.

25. The apparatus of claim 24 wherein said sheet is fed through said apparatus along a substantially horizontal sheet path, and rollers of said first and second pairs are disposed vertically above said sheet path and the other rollers of said pairs disposed vertically below said sheet path, and wherein said pneumatic cylinder means is arranged to apply a first preload force on said cleaning roller disposed above said sheet in a substantially vertical downward direction.

26. The apparatus of claim 25 wherein said second preloading means comprises second pneumatic cylinder means for urging said second roller cleaning surface against the others of said pairs of sheet cleaning roller surfaces disposed below said sheet, and second pressure adjusting means for adjusting the pneumatic pressure applied to said second cylinder means to thereby adjust said second preload force.

27. The apparatus of claim 24 wherein said sheet is fed through said apparatus along a substantially horizontal sheet path, and wherein said first pneumatic cylinder means is arranged to apply a first preload force on said respective cleaning rollers located above said sheet in a substantially vertical downward direction.

28. The apparatus of claim 27 wherein said second pneumatic cylinder means is arranged to apply a second preload force on said respective cleaning rollers located above said sheet in a substantially vertical upward direction.

29. A sheet cleaning apparatus for cleaning foreign particles from at least one surface of a sheet comprising a lamination of a plurality of layers, comprising:

a frame;

a sheet cleaning roller rotatably mounted on said frame for rotation about a sheet cleaning roller axis and comprising a layer of resilient material defining a peripheral roller surface with a high surface tack adapted to transfer foreign particles from said sheet to said peripheral roller surface upon contact and subsequent separation therebetween while affording clean separation between the sheet and said peripheral surface;

a roller cleaning member having a contact surface with a width about the same as a width of said sheet cleaning roller surface, said contact surface having a greater surface tack with respect to said foreign particles than said sheet cleaning roller surface, said contact surface adapted to transfer said foreign particles from said peripheral surface of said cleaning roller to said contact surface of said roller cleaning member, said roller cleaning member comprising a roll having an external surface defining said contact surface and a cleaning element axis arranged substantially parallel to said roller axis; and means for preventing said layers from becoming delaminated due to adhesive forces between said tacky sheet cleaning roller surface and said sheet surface.

30. The cleaning apparatus of claim 29 wherein said means for preventing said layers from becoming delaminated comprises an endless belt reeved about a first pulley disposed on a downstream side of said sheet cleaning roller and arranged to fit into a peripheral groove defined in said roller, said belt arranged to rotate with said roller and contacting said surface along a region downstream from said roller to keep a surface layer of said sheet from delaminating.

* * * * *